United States Patent
Span et al.

(10) Patent No.: US 8,952,235 B2
(45) Date of Patent: Feb. 10, 2015

(54) THERMO-ELECTRIC ARRANGEMENT

(75) Inventors: Gerhard Span, Wattens (AT); Martin Wagner, Bad Mitterndorf (AT)

(73) Assignee: O-Flexx Technologies GmbH, Duisburg (DE)

( * ) Notice: Subject to any disclaimer, the term of this patent is extended or adjusted under 35 U.S.C. 154(b) by 57 days.

(21) Appl. No.: 13/984,645

(22) PCT Filed: Mar. 7, 2012

(86) PCT No.: PCT/EP2012/053877
§ 371 (c)(1),
(2), (4) Date: Aug. 9, 2013

(87) PCT Pub. No.: WO2012/130568
PCT Pub. Date: Oct. 4, 2012

(65) Prior Publication Data
US 2013/0312803 A1 Nov. 28, 2013

(30) Foreign Application Priority Data
Mar. 30, 2011 (DE) .................. 10 2011 001 653

(51) Int. Cl.
*H01L 35/32* (2006.01)
(52) U.S. Cl.
CPC .................................... *H01L 35/32* (2013.01)
USPC ......................................... 136/205; 136/201
(58) Field of Classification Search
CPC ..................................................... H01L 35/32
USPC ................................................ 136/205, 201
See application file for complete search history.

(56) References Cited

U.S. PATENT DOCUMENTS 3,956,017 A   5/1976 Shigemasa
4,081,895 A * 4/1978 Germano et al. ............. 136/211
(Continued)

FOREIGN PATENT DOCUMENTS

DE   10 2007 050 741 A1   4/2009
DE   10 2008 023 806 A1   11/2009
(Continued)

OTHER PUBLICATIONS

English translation of International Preliminary Report on Patentability.
(Continued)

*Primary Examiner* — Golam Mowla
(74) *Attorney, Agent, or Firm* — Lucas & Mercanti, LLP

(57) ABSTRACT

The invention relates to an arrangement comprising a thermo-electric generator having a hot side which absorbs heat from a heat source, a cold side which discharges heat to a heat sink, and electrical terminals for outputting electrical energy with an output voltage and an electric circuit with a maximum permissible input voltage, the inputs of which are connected to the electrical terminals of the thermo-electric generator. Such arrangements may be used, for example, in exhaust systems of motor vehicles for more efficient use of the energy. In order to provide such an arrangement, which can be connected to a heat source, in particular an exhaust system of an internal combustion engine, largely independently of the magnitude of the temperature difference between the hot and cold sides of the thermo-electric generator, it is proposed that the thermo-electric generator be configured in such a way that saturation of the output voltage occurs below the maximum permissible input voltage of the electric circuit, or when said maximum permissible input voltage is reached.

5 Claims, 5 Drawing Sheets

(56) References Cited

U.S. PATENT DOCUMENTS

| | | | |
|---|---|---|---|
| 4,500,741 A | 2/1985 | Morimoto | |
| 2003/0042497 A1* | 3/2003 | Span | 257/121 |
| 2007/0095381 A1* | 5/2007 | Lee | 136/230 |
| 2007/0289620 A1 | 12/2007 | Stark | |
| 2009/0025773 A1 | 1/2009 | Stark | |

FOREIGN PATENT DOCUMENTS

| | | |
|---|---|---|
| EP | 1 287 566 B1 | 10/2003 |
| GB | 2145876 A | 4/1985 |

OTHER PUBLICATIONS

Gerhard Span, et al: "Miniaturized TEG with thermal generation of free carriers", Physica Status Solidi (Rapid)—Rapid Research Letter, vol. 1, No. 6, Nov. 1, 2007, pp. 241-243 XP55035376, ISSN: 1832-6254, DOI: 10.1002/pssr 200701171.

Wagner M, et al: :Design Optimization of Large Area Si/SiGe Thermoelectric Generators, Simulation of Semiconductor Processes and Devices, 2006 International Conference on, IEEE, PI, Sep. 1, 2006, pp. 397-400, XP031008881, ISBN:978-1-4244-0404-9.

* cited by examiner

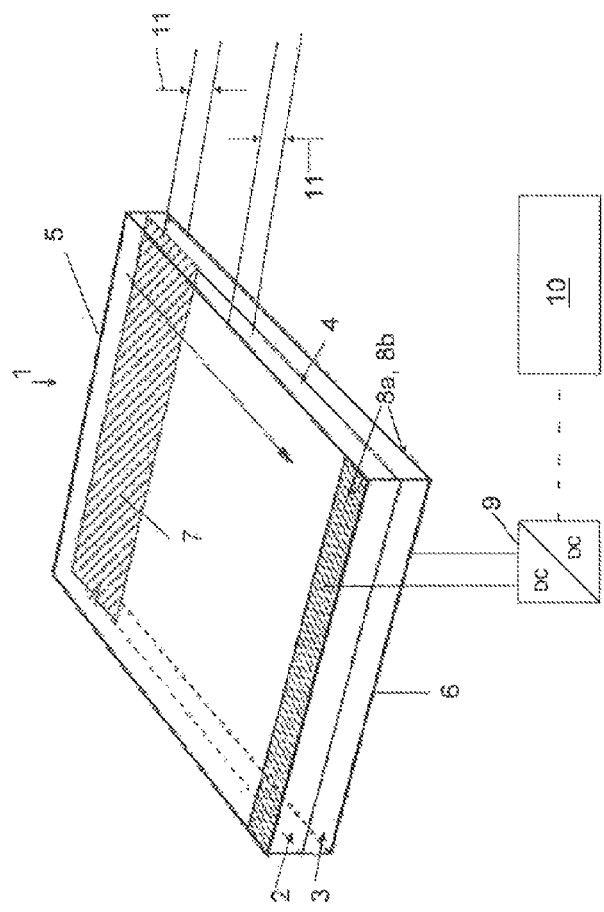
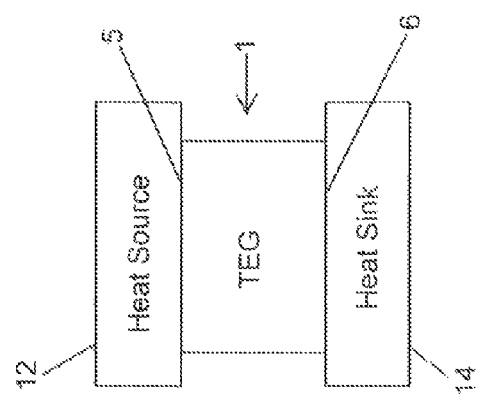
FIG. 1a
FIG. 1b

THERMO-ELECTRIC ARRANGEMENT

CROSS-REFERENCE TO RELATED APPLICATIONS

This application is a 371 of PCT/EP2012/053877 filed Mar. 7, 2012, which in turn claims the priority of DE 10 2011 001 653,8 filed Mar. 30, 2011, the priority of both applications is hereby claimed and both applications are incorporated by reference herein.

BACKGROUND OF THE INVENTION

The invention relates to an arrangement comprising a thermo-electric generator having a hot side which absorbs heat from a heat source, a cold side which discharges heat to a heat sink, and electrical terminals for outputting electrical energy with an output voltage and an electric circuit with a maximum permissible input voltage, the inputs of which are connected to the electrical terminals of the thermo-electric generator. Furthermore, the invention relates to a method for operating such an arrangement.

A thermo-electric generator, also referred to for short as TEG, is a device which converts heat energy into electrical energy using the thermo-electric effect.

The thermo-electric effect, also referred to as the Seebeck effect, describes the reversible interaction between temperature and electricity. The Seebeck voltage is determined by $$U_{Seebeck} = \alpha \times \delta T$$

where
 $\delta T$ is the temperature difference between the hot and cold sides
 $\alpha$—is the Seebeck coefficient or thermo-electric force.

The Seebeck coefficient has the dimension of an electric voltage per temperature difference (V/K). The value of the Seebeck coefficient is responsible to a decisive degree for the magnitude of the Seebeck voltage.

A thermo-electric generator is composed of differently doped semiconductor materials. Customary semiconductor materials for thermo-electric generators are semiconductor materials such as in particular, $Bi_2Te_3$, $Bi_2Se$, $Sb_2Te_3$, $PbTe$, $SiGe$ or $FeSi_2$ and the alloys thereof.

A conventional thermo-electric generator is constructed from two or more small squares which are each made of p-type doped and n-type doped semiconductor material and are alternately connected to one another at the top and the bottom by metal bridges. The metal bridges form at the same time the thermal contact faces and are usually insulated by a ceramic plate. The different squares made of p-type and n-type domed doped semiconductor material are connected electrically in series. The ceramic plates are at a distance of approximately 3 mm to 5 mm from each other and the squares are arranged, in particular soldered into place between them. One of the ceramic plates forms the hot side and the ceramic plate lying opposite forms the cold side, of the thermo-electric generator. The hot side absorbs heat from a heat source, while the cold side discharges heat to a heat sink. Bringing about the temperature difference $\delta_T$ between the hot and cold sides causes the Seebeck voltage $U_{Seebeck}$ to be generated at the terminals of the thermo-electric generator.

EP 1 287 566 B1 discloses a thermo-electric element and a module with a plurality of thermo-electric elements connected electrically in series, in order to increase the efficiency of a thermo-electric generator. The thermo-electric element has at least one n-type layer and at least one p-type layer of one or more doped semiconductors, wherein the n-type layer/layers and the p-type layer/layers are arranged by forming at least one pn junction. At least one n-type layer and at least one p-type layer are placed in electrically selective contact and a temperature gradient is applied in parallel (x direction) with the boundary layer, between at least one n-type layer and one p-type layer. At least one pn junction is formed essentially along the entire, preferably longest, extent of the n-type layer/layers and the layer/layers, and therefore essentially along the entire boundary layer thereof.

As a result of the temperature gradient along the large-area pn boundary face there is a temperature difference along this elongate pn transition between two ends of a pn layer assembly which causes the efficiency of the thermo-electric element to be higher than in conventional thermo-electric generators which do not have a temperature gradient along and within the pn junction. The thermo-electric elements are arranged thermally in parallel between two plates in the module. The plates serve to bring about improved thermal coupling both on the cold and hot sides. They are preferably embodied as good thermal conductors and are, in particular, composed of ceramic, electrically non-conductive materials. The disclosure of EP 1 287 566 B1, in particular with respect to the structure of the thermo-electric element (FIG. 3) and of the module (FIG. 13) as well as with respect to the semiconductor materials used, is included expressly in the present application.

An arrangement of the generic type is disclosed in DE 10 2008 023 806 A1. The arrangement is integrated into the exhaust system of a motor vehicle in which what is referred to as the hot side of the TEG is connected in a thermally conductive fashion to an exhaust-gas-conducting line of the exhaust section, while the cold side of the TEG is thermally coupled, for example, to a coolant line, conducting a coolant, of the engine cooling system of the motor vehicle. The TEG is connected electrically into the on-board electrical system of the motor vehicle via a direct voltage connection device in the form of a direct voltage transformer. The arrangement composed of the TEG and the direct voltage transformer improves the energetic efficiency of the motor vehicle considerably. However, the integration of the arrangement into the exhaust system of the motor vehicle requires a redesign of the exhaust system. The exhaust system comprises an exhaust duct which has two component exhaust ducts running in parallel, wherein the component exhaust ducts are combined again downstream. One of the two component exhaust ducts is thermally coupled to the thermo-electric generator, wherein at least switching element for directing the stream of exhaust gas is present in the exhaust duct in such a way that depending on the switched position of the switching element the stream of exhaust gas flows exclusively through the first component exhaust duct, exclusively through the second component exhaust duct or proportionally through both component exhaust ducts. In addition, a control device is provided for actuating the at least one switching element. The output voltage of the thermo-electric generator which is arranged in the component exhaust duct is virtually proportional to the temperature difference between the hot and cold sides of the thermo-electric generator. In order to avoid damage to the direct voltage transformer which is connected to the thermo-electric generator and to the on-board electrical, system of the motor vehicle by an excessively high output voltage of the thermo-electric generator in certain operating situations, it is necessary to conduct hot exhaust gases past the thermo-electric generator. This bypass solution makes it possible to configure the thermo-electric generator for medium motor power levels and therefore exhaust gas temperatures and exhaust gas mass flow rates which make up the greater part of the driving cycle. Furthermore, the direct voltage transformer can be configured for the medium power range which is used most frequently. However, a significant disadvantage of the prior art is that the exhaust system has to have two component exhaust ducts running in parallel and in addition controlled switching elements have to be installed in the exhaust section.

BRIEF SUMMARY OF THE INVENTION

Taking this prior art as a starting point, the invention is based on the object of providing a thermo-electric generator which can be connected to a heat source, in particular an exhaust system of an internal combustion engine, largely independently of the magnitude of the temperature difference between the hot and cold sides of the thermo-electric generator, wherein damage to an the electric circuit, connected to the thermo-electric generator, owing to the maximum permissible input voltage thereof being exceeded is to be avoided without changes to the heat source, in particular the exhaust system.

This object is achieved with an arrangement of the type mentioned at the beginning in that the thermo-electric generator comprises at least one thermo-electric element which is composed, in each case of at least one n-type layer and at least one p-type layer made of thermo-electric material by forming at least one pn junction which is formed along a boundary layer, wherein a temperature gradient can be applied parallel to the boundary layer between the hot and the cold side of the thermo-electric generator, and the thermo-electric generator is configured in such a way that saturation of the output voltage occurs below the maximum permissible input voltage of the electric circuit, or when said maximum permissible input voltage is reached.

The thermo-electric generator comprises at least one thermo-electric element which is known per se from EP 1 287 566 B1. The exceeding of the maximum permissible input voltage of the electric circuit is prevented by virtue of the fact that the output voltage of the thermo-electric generator no longer increases appreciably starting from a certain temperature difference between hot and cold sides. This saturation of the output voltage preferably takes place when the maximum permissible input voltage is reached, or slightly below said voltage. Damage to the electric circuit and subsequent components is effectively avoided without complicated interventions into the beet source or heat sink. In particular, when the arrangement according to the invention is integrated into the exhaust system of a motor vehicle, there is no longer any need for a component exhaust duct as a bypass excessively hot gases. Furthermore, the switching elements and the control device for actuating the switching elements are eliminated.

In the thermo-electric generator which comprises at least one thermo-electric element which is known per se from EP 1 287 566 B1, the occurrence of the saturation of the output voltage depends on how the transportation capability of the thermo-electric layers and the generation efficiency of the pn junction at which a temperature gradient is applied are matched to one another. In the case of constant parameters such as, in particular, the length and width of the thermo-electric generator, doping and defect density, the saturation behavior of the thermo-electric generator is set, preferably by means of the thickness of the n-type and p-type layers. As the layers become thicker, the value at which the saturation of the output voltage occurs increases. Consequently by changing the thickness of the layer it is possible to adapt the thermo-electric generator to the maximum permissible input voltage of the electric circuit.

In one advantageous refinement of the invention, the arrangement comprises a heat source which is thermally coupled to the hot side of the thermo-electric generator. The thermal coupling can be effected, for example, by using a heat exchanger. In particular, a component of an exhaust system of an internal combustion engine serves as a heat source, wherein owing to the arrangement according to the invention there is no need for structural adaptation of the exhaust system.

The invention will be explained in more detail below with reference to the figures, of which:

BRIEF DESCRIPTION OF THE DRAWINGS

FIGS. 1A and 1B show schematic illustrations of an arrangement according to the invention.

DETAILED DESCRIPTION OF THE PREFERRED EMBODIMENT

Figure 2:
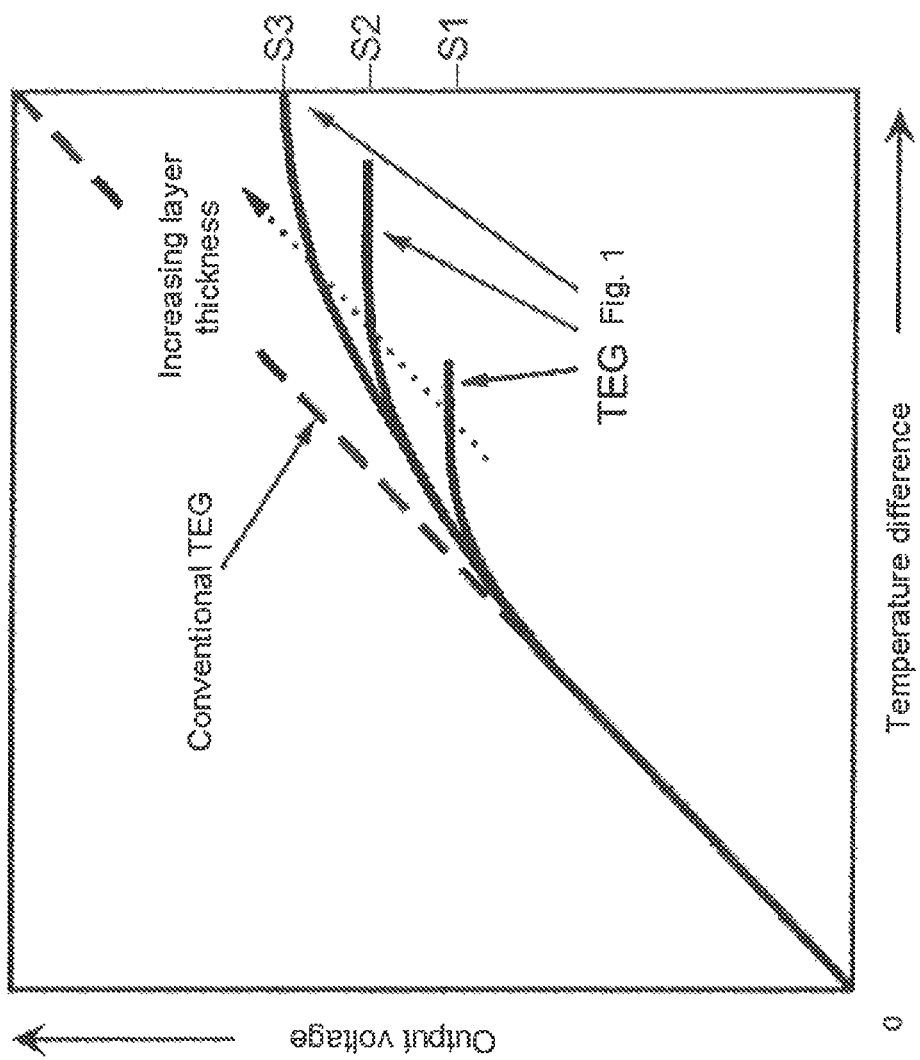
FIG. 2 shows an illustration of the output voltage of differently configured thermo-electric generators according to FIG. 1 as a function of the temperature difference.

FIGS. 1*a* and 1*b* show an arrangement according to an embodiment of the invention having a thermoelectric generator (1) which is known per se from EP 1 287 566 B1 and which in the illustrated exemplary embodiment comprises, in simplified form, merely one thermoelectric element which is composed of a p-type layer (2) made of thermoelectric material and an n-type layer (3) made of thermo-electric material by forming a pn junction (4) which is formed along the boundary layer. At the upper end side of the layer assembly, the thermo-electric generator (1) has a hot side (5), and on the opposite end side it has a cold side (6). Along the boundary layer between the hot and cold sides (5, 6) it is possible to apply a temperature gradient in which the hot side absorbs heat from a heat source 12, for example an exhaust system of an internal combustion engine, and the cold side discharges heat to a heat sink 14, for example a coolant line of the internal combustion engine or else to the ambient air. When a temperature difference is present between the hot and cold sides (5, 6), charge carriers (electrons and holes) on the hot side (5) of the pn junction (4) are generated thermally in a generation zone (7). The charge carriers are separated by the built-in potential of the pn junction (4) and transported from the hot side (5) to the cold side (6) as a result of the Seebeck effect in the n-type and p-type layers. On the cold side (6), the charge carriers are discharged by electrical terminals (8*a*, 8*b*) in the form of contacts. The electrical terminals (8*a*, 8*b*) of the thereto-electric generator (1) are connected to an electric circuit (9), specifically a direct voltage transformer. The direct voltage transformer serves the purpose of inputting the electrical energy generated by the thermoelectric generator (1) into a schematically illustrated on-board electrical system (10) of a motor vehicle.

In the case of increasing temperature differences, the thermo-electric generator (1) has two operating ranges—the generation-limited range and the transportation-limited range. In the generation-limited range, the greater part of the charge carriers which are generated on the hot side (5) are conducted away to the electrical terminals (8a, 8b). The number of generated charge carriers increases exponentially with the temperature, wherein owing to the thermal conductivity of the thermo-electric generator (1) a corresponding temperature gradient occurs along the pn junction (4). If an excess of charge carriers is generated at relatively high temperatures in the transportation-limited range for a certain thickness of the n-type and p-type layers (2, 3), a new equilibrium is established along the n-type and p-type layers, and charge carriers recombine again on their way to the electrical terminals (8a, 8b). This results in an output voltage which, as the temperature difference increases, firstly increases gently and then becomes saturated.

The transition between the generation-limited range and the transportation-limited range, and therefore the temperature difference at which saturation of the output voltage occurs, therefore depends on the transportation capability of the n-type and p-type layers (2, 3) and the generation efficiency of the pn junction (4). For given parameters, such as the length of the thermo-electric generator, the doping and the defect density, it is therefore possible to set the transportation behavior of the n-type and p-type layers (2, 3) most simply by changing the thickness (11) of the n-type and p-type layers (2, 3). Typical thicknesses of the p-type and n-type layers are in the range between 10 and 100 μm, while the typical length of the thermo-electric generator is in the millimeter range.

The above explanations illustrate that by determining the thickness of the n-type and p-type layers (2, 3) it is possible to set the magnitude of the maximum output voltage of the thermo-electric generator (1). As a result, the maximum output voltage of the thermo-electric generator (1) within the arrangement according to the invention can be adapted to the maximum permissible input voltage of the electric circuit (9).

FIG. 2 illustrates the relationship between the layer thickness of the n-type and p-type layers (2, 3) and the saturation of the output voltage. The dashed line which is illustrated in FIG. 2 shows the behavior of a conventional thermo-electric generator in which the output voltage increases proportionally with the temperature difference between the hot and cold sides of the thermo-electric generator. The continuous lines relate, moreover, to the behavior of the output voltage of a thermo-electric generator (1) at which saturation of the output voltage occurs at different values of the output voltage over the thickness (11) of the n-type and p-type layers (2, 3). The saturation of the output voltage increases as the p-type and n-type layers (2, 3) become thicker. For the comparatively smallest thickness (11) the p-type and n-type layers (2, 3), saturation occurs at an output voltage (S1), for the medium thickness (11) it occurs at an output voltage (S2), and for the largest thickness (11) it occurs at an output voltage (S3). Since the n-type and p-type layers (2, 3) with a relatively large thickness have a higher transportation capability for the charge carriers, the temperature difference at which the saturation of the output voltages (S1-S3) respectively occurs is also shifted upward.

Figure 3:
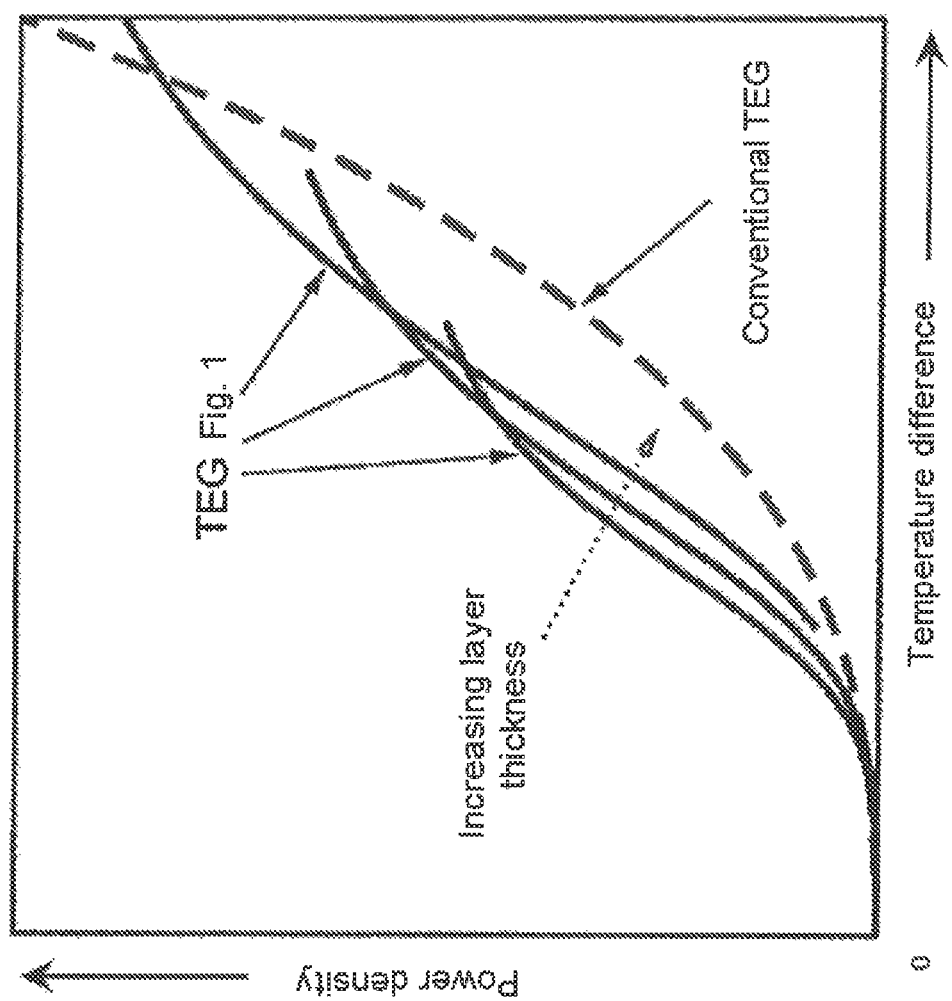
FIG. 3 shows an illustration of the power density of differently configured thermo-electric generators as a function of the temperature difference which is present.

FIG. 3 shows that at comparatively low temperature differences relatively thin n-type and p-type layers (2, 3) prove advantageous since owing to the relatively small temperature difference fewer charge carriers are generated in the generation zone (7) and can be effectively transported from the n-type and p-type layers (2, 3) to the terminals (8a, 8b). With increasing temperature differences, a higher power density is produced for the relatively thick n-type and p-type layers (2, 3). FIG. 3 also shows that the output power of a conventional thermo-electric generator increases virtually quadratically with the temperature difference, while the output power of the thermo-electric generator (1) firstly increases exponentially, that is to say increases more than quadratically with the temperature difference, and in the case of relatively high temperature difference values is limited by the saturation of the output voltage. This behavior of the thermo-electric generator (1) allows the output power to be optimized for a specific temperature difference in comparison with a thermo-electric generator of conventional design. The arrangement can therefore be adapted particularly efficiently to an exhaust system of an internal combustion engine which is operated in the medium power range.

Figure 4:
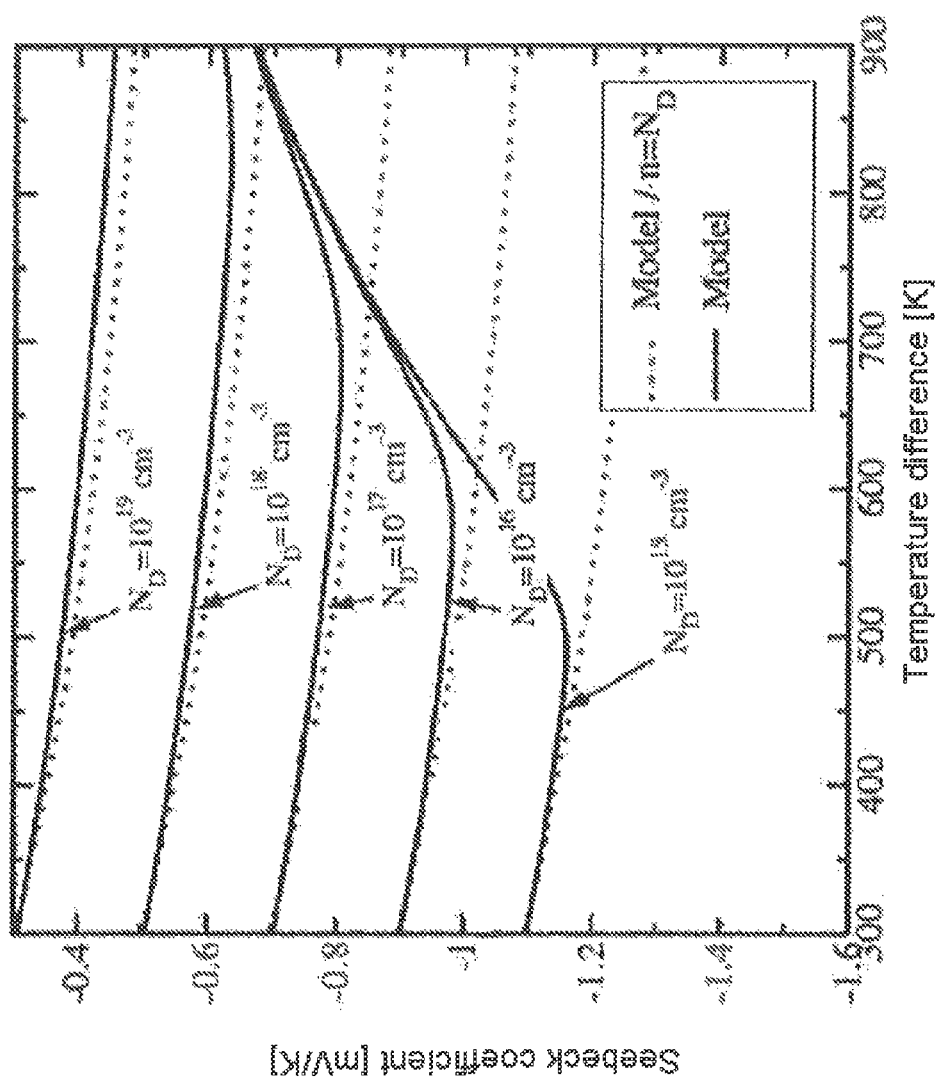
FIG. 4 shows an illustration of the Seebeck coefficient for n-type doped silicon with various dopant concentrations.
Figure 5:
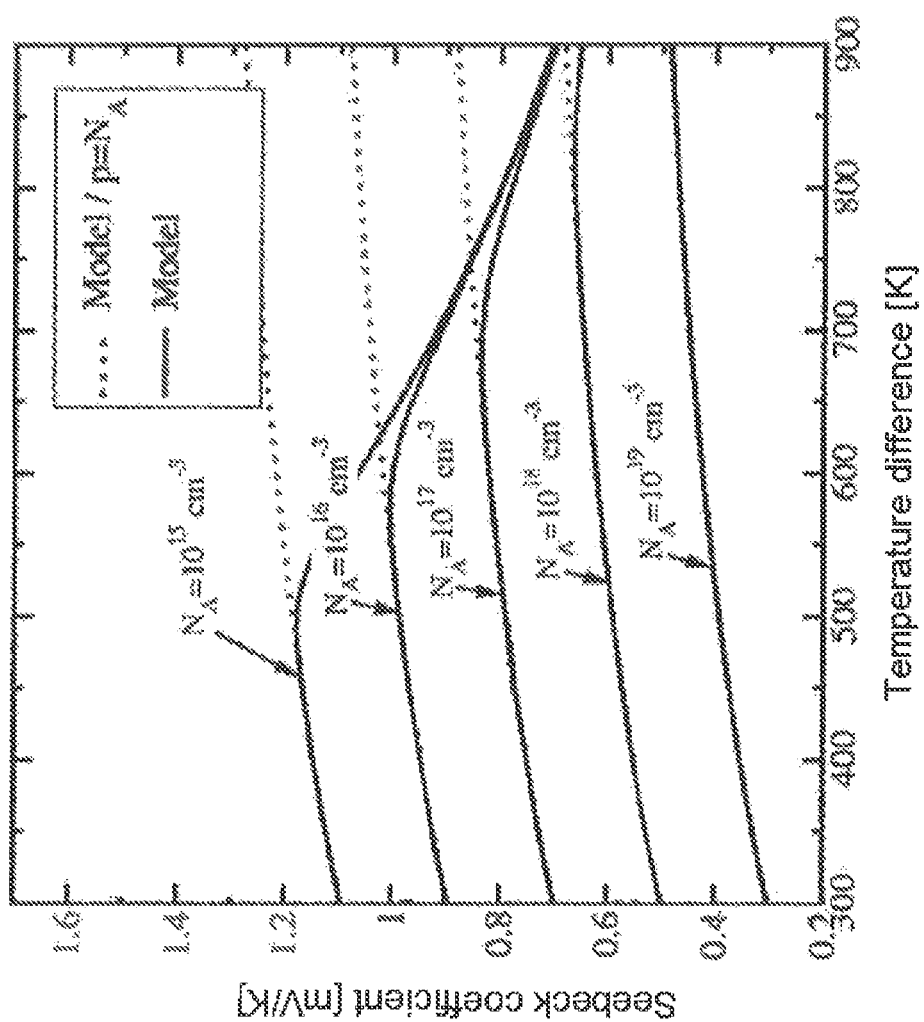
FIG. 5 shows an illustration of the Seebeck coefficient for p-type doped silicon with various dopant concentrations.

Free charge carriers, and therefore the conductivity, but also the Seebeck coefficient, in a semiconductor are set by the doping of the material. A distinction is made between the intrinsic and extrinsic semiconductors which are mentioned in this way, wherein each semiconductor with an increasing temperature enters the intrinsic range. While in an extrinsic semiconductor only one type of charge carrier, (that is to say either electrons or holes, depending on the type of doping) contributes to the electrical transportation, in the intrinsic semiconductor both types of charge carrier are present as a result of thermal generation. Since the thermal drift acts on both types of charge carrier in the same direction (from warm to cold), but the charge carriers have charges with different signs and also have Seebeck coefficients with different signs, the Seebeck coefficient of a doped semiconductor drops severely at the transition from the extrinsic to the intrinsic range as a result of the contributions of the respectively different additionally occurring charge carriers (electrons in the p-type semiconductor region, holes in the n-type semiconductor region) which have the incorrect sign (FIGS. 4 and 5). The figures show values for differently doped silicon samples, but the underlying behavior is analogous for other semiconductor materials.

Owing to the above behavior, the saturation of output voltage can also be set by means of the doping of the n-type and p-type semiconductor material.

| List of Reference Numbers | |
|---|---|
| No. | Designation |
| 1 | Thermo-electric generator |
| 2 | p-type layer |
| 3 | n-type layer |
| 4 | pn junction |
| 5 | Hot side |
| 6 | Cold side |
| 7 | Generation zone |
| 8a, b | Electrical terminals |
| 9 | Electric circuit |
| 10 | On-board electrical system |
| 11 | Thickness |

The invention claimed is:
1. An arrangement, comprising:
a thermo-electric generator having a hot side, which absorbs heat from a heat source, and a cold side, which discharges heat to a heat sink, and electrical terminals for outputting electrical energy having an output voltage; and
an electric circuit having inputs connected to the electrical terminals of the thermo-electric generator, the electric circuit having a maximum permissible input voltage,
wherein the thereto-generator includes at least one thermo-electric element having at least one n-type layer of thermo-electric material and at least one p-type layer of thermo-electric material, a pn junction being formed along a boundary layer between the at least one p-type layer and the at least one n-type layer, a temperature gradient between the hot side and the cold side being parallel to the boundary layer, and wherein each of the at least one n-type layer and the at least one p-type layer has a thickness at which the saturation of the output voltage occurs at or below the maximum permissible input voltage of the electric circuit.

2. The arrangement of claim 1, further comprising a heat source thermally coupled to the hot side of the thermo-electric generator.

3. The arrangement of claim 2, wherein the heat source is a component of an exhaust system of an internal combustion engine.

4. The arrangement of claim 1, wherein the electric circuit is a direct voltage transformer.

5. A method for operating an arrangement comprising a thermo-electric generator and an electric circuit, the thereto-electric generator having a hot side for absorbing heat from a heat source, a cold side for discharging heat to a heat sink, and electrical terminals for outputting electric energy having an output voltage, the electric circuit having inputs connected to the electrical terminals of the thermo-electric generator and having a maximum permissible input voltage, the method comprising:

forming a temperature difference between the hot side and the cold side by absorbing, by the hot side, heat from the heat source and discharging, by the cold side, heat to the heat sink; and configuring the thermo-electric generator so that:
in a first value range for the temperature difference with increasing values, the output voltage is increased up to a maximum output voltage that is less than or equal to the maximum permissible input voltage of the electric circuit, and in a second value range for the temperature difference with increasing values, the output voltage of the thereto-electric generator is not increased further, wherein the temperature differences of the second value range are higher than the temperature differences in the first value range.

* * * * *